United States Patent [19]
Petty et al.

[11] Patent Number: 5,311,147
[45] Date of Patent: May 10, 1994

[54] HIGH IMPEDANCE OUTPUT DRIVER STAGE AND METHOD THEREFOR

[75] Inventors: Thomas D. Petty; Robert L. Vyne, both of Tempe, Ariz.

[73] Assignee: Motorola Inc., Schaumburg, Ill.

[21] Appl. No.: 966,486

[22] Filed: Oct. 26, 1992

[51] Int. Cl.5 .............................................. H03F 1/34
[52] U.S. Cl. ..................................... 330/290; 330/291; 330/293
[58] Field of Search ............... 330/259, 260, 261, 290, 330/291, 293

[56] References Cited

U.S. PATENT DOCUMENTS

| | | | |
|---|---|---|---|
| 3,717,821 | 2/1973 | Amemiya et al. | 330/260 X |
| 3,845,405 | 10/1974 | Leidich | 330/298 |
| 4,123,722 | 10/1978 | Cubbison, Jr. | 330/261 X |
| 4,263,562 | 4/1981 | Seiler | 330/261 X |
| 5,179,356 | 1/1993 | Kröner | 330/291 X |

FOREIGN PATENT DOCUMENTS

| | | | |
|---|---|---|---|
| 241211 | 9/1990 | Japan | 330/290 |
| 1251290 | 8/1986 | U.S.S.R. | 330/261 |

Primary Examiner—James B. Mullins
Attorney, Agent, or Firm—Michael D. Bingham; Gary W. Hoshizaki

[57] ABSTRACT

A high impedance output driver stage (16) for reducing loading on a gain stage (18) which drives an output stage (19). The output stage (19) is responsive to an input current. A current sense circuit (21) senses current of output stage (19). The current sense circuit (21) outputs a current proportional to the current sensed in the output stage (19). A current source circuit (22) is responsive to the current output by the current sense circuit (21) and outputs a current substantially equal to the input current of the output stage (19) thereby reducing loading on the gain stage (18).

19 Claims, 2 Drawing Sheets 5,311,147

1

HIGH IMPEDANCE OUTPUT DRIVER STAGE AND METHOD THEREFOR

BACKGROUND OF THE INVENTION

This invention relates, in general, to amplifiers, and more particularly to circuits for buffering a gain stage from an output stage.

A common form of an amplifier comprises an input gain stage (or first gain stage), a second gain stage, and an output stage. Those skilled in the art will also know that the second gain stage is often combined with the output stage. For this case, the output stage is defined as the circuitry which drives a load external to the amplifier. Each amplifier stage interacts with the other amplifier stages. This interaction affects performance of each amplifier stage as well as the overall performance of the amplifier. Design of an amplifier, in part, is the melding of each amplifier stage, which in some cases means compromising performance of a particular stage for the benefit of amplifier performance in total. Of particular concern is the effect of the output stage on the second gain stage, or more generally, a gain stage coupled to a high drive stage.

For example, the second gain stage provides an amplified voltage signal which is coupled to the output stage. The output stage generally does not have voltage gain but provides current drive to a load external to the amplifier. The output stage may be required to sink or source a current of significant magnitude depending on the external load. Under high drive conditions the output stage may present a low impedance load to the second gain stage. The second gain stage performance may be severely degraded by the low impedance load presented by the output stage for some circuit configurations. One approach to solve this problem is to add a buffer stage between the second gain stage and the output stage. Ideally, the buffer stage presents a high impedance load to the second gain stage while having the capability to drive a low impedance load (such as the input of an output stage).

A first circuit configuration of a buffer stage used between the second gain stage and an output stage is a bipolar transistor Darlington configuration. Those skilled in the art know that Darlington configured bipolar transistors have high current gain and high input impedance, both parameters are critical for the design of a good buffer stage. The Darlington configured buffer stage has been used successfully in an operational amplifier such as the MC33077 manufactured by Motorola Inc. The Darlington configured buffer stage is not without problems which limit its applications in many amplifier designs. The main problem with the Darlington configured buffer stage is that it affects the frequency response of the amplifier by adding phase shift which can cause amplifier instability when using feedback. The added phase shift contributed by the Darlington configured buffer stage is enough to limit amplifier performance or complicate the amplifier compensation scheme to the point where alternative circuit approaches are preferential to the Darlington configuration.

A second circuit configuration commonly used throughout the industry is a PNP bipolar transistor coupled to a current source. The PNP bipolar transistor is coupled to a gain stage in a voltage follower configuration for buffering the gain stage from a high drive stage. An example of this type of stage is in a MC33174

2 operational amplifier manufactured by Motorola Inc. PNP transistors in many semiconductor process flows have inferior performance characteristics than NPN transistors fabricated in the same process. This is the case for the MC33174 operational amplifier which must add additional circuitry to account for the performance deficiencies of using PNP transistors. Like the Darlington configured transistors a PNP based buffer stage adds phase shift to the amplifier loop, thus complicating amplifier compensation. Feed-forward capacitors are sometimes used to bypass the PNP transistor for high frequency signals due to the slow response time of the PNP transistor (adding more components to the amplifier design). If the PNP buffer stage is coupled to a differential gain stage, base current from the PNP buffer must be taken into account, otherwise, an offset could be induced into the amplifier. This is resolved by adding a dummy stage which mimics the base current from the PNP buffer but at the cost of more circuitry.

It would be of great benefit if a buffer stage could be developed which buffers a gain stage from an output stage (or high drive stage). The buffer stage should present a high impedance load to the gain stage, have the capability to drive a low impedance high drive stage, add minimal phase shift to the circuit, and keep component counts low.

SUMMARY OF THE INVENTION

Briefly stated, this invention provides an output stage having a high input impedance. A high impedance output stage comprises an output stage, a current sense circuit, and a current source circuit. The output stage has an input and an output. The output stage is responsive to an input current and generates an output current. The current sense circuit senses input or output current of the output stage and generates a sense current proportional to the input current of the output stage. The current source circuit has an input which is responsive to the sense current from the current sense circuit and has an output coupled to the input of the output stage. The current source circuit outputs a current substantially equal to the input current of the output stage.

DETAILED DESCRIPTION OF THE DRAWINGS

Figure 1:
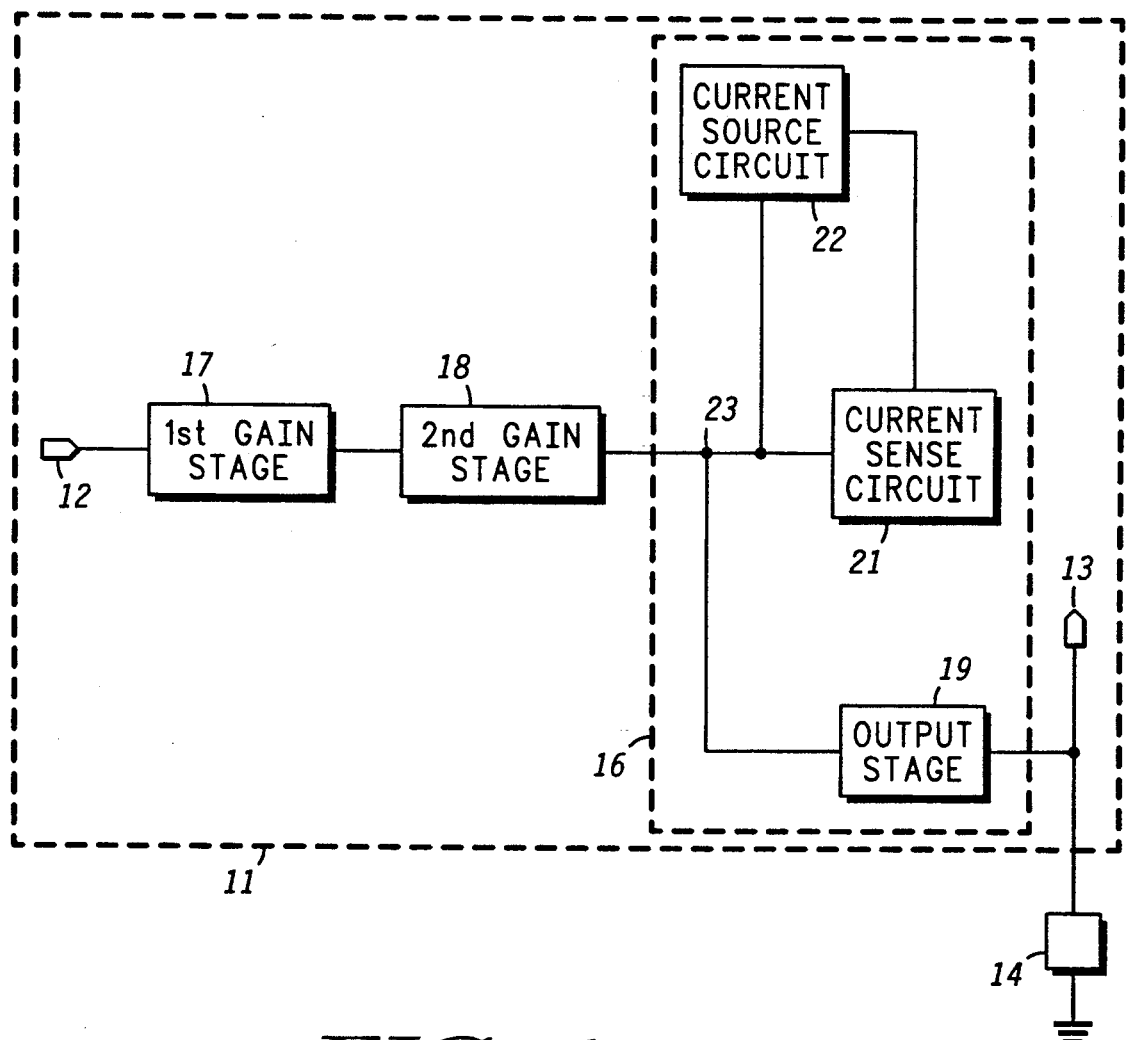
FIG. 1 is a block diagram of an amplifier in accordance with the present invention.

FIG. 1 is a block diagram of an amplifier having a high impedance output stage in accordance with the present invention.

An amplifier is ideal for illustrating the interaction between a gain stage coupled to an output stage (or high drive stage). A gain stage, typically, is designed to amplify a voltage signal by a predetermined gain. This contrasts greatly to an output stage, the output stage is designed to drive a load external to the amplifier and typically does not have voltage gain. The load or impedance presented by the output stage to the gain stage can impact performance of the gain stage. For example, the impedance of an output stage for some types of circuits varies with output current (of the output stage). Under high drive conditions the output stage can present a low impedance load to the gain stage. The increased loading of the gain stage under high drive conditions can affect amplifier characteristics such as voltage gain, voltage offset or stability. The design of a gain stage with stable characteristics under a wide variation of loading conditions is difficult to achieve at best. A common approach used by those skilled in the art is to add a buffer stage between the gain stage and the output stage to alleviate the loading problem. The buffer stage presents a high impedance load to the gain stage yet can drive a low impedance load (output stage). The main problem with the buffer stage is that it affects frequency response and stability of the amplifier. It is placed directly in the gain path through the amplifier and adds phase shift which reduces amplifier stability when feedback is used. Additional circuitry can be added to the buffer stage to compensate for these deficiencies but it will increase silicon area and circuit complexity. A solution to the problem of gain stage loading is to directly couple the gain stage to the output stage (thus eliminating phase shift added by buffer stages) and using a circuit (peripheral to the gain path) which senses and supplies an "appropriate current" to the output stage thereby eliminating the gain stage from sourcing any significant current. Thus, the output stage does not load the gain stage. This approach is the basis for creating a high impedance output driver stage 16.

An amplifier 11 has an input 12 for receiving an input signal to be amplified and an output 13. Amplifier 11 has two gain stages, a first gain stage 17 and a second gain stage 18. The benefits of using two stages of gain in amplifier design (such as an integrated operational amplifier) is well known in the art. First gain stage 17 has an input coupled to amplifier input 12 and a output coupled to an input of second gain stage 18. An output of second gain stage 18 is coupled to a node 23. An output stage 19 for driving a load 14 has an input coupled to node 23 and an output coupled to amplifier output 13. Note that the input of output stage 19 is directly coupled to the output of second gain stage 18 by node 23, thus, nothing is inserted in the gain path through amplifier 11 to add additional phase shift.

The high impedance output driver stage 16 comprises output stage 19, current sense circuit 21, and current source circuit 22. Current sense circuit 21 serves as a means for sensing current. Current sense circuit 21 has an input coupled to node 23 for sensing a current of output stage 19 (either input current or output current of the output stage) and an output. Current sense circuit 21 generates a current proportional to the input current to output stage 19. Current source circuit 22 serves as a means for sourcing current. Current source circuit 22 has an input coupled to the output of current sense circuit 21 and an output coupled to node 23. Current source circuit 22 is responsive to the current output from current sense circuit 21 and generates a current "substantially equal" to the input current of output stage 19. Ideally, second gain stage 18 does not supply any current to output stage 19 if the current supplied by current source circuit 22 is exactly equal to the current needed by output stage 19, thus output stage 19 would appear as an infinite impedance (open circuit) to second gain stage 18. Both second gain stage 18 and output stage 19 can be optimized to perform their appropriate tasks without compromising overall performance of amplifier 11 since the impedance presented by output stage 19 does not impact second gain stage 18 performance.

High impedance output driver stage 16 is an active circuit which first senses current of output stage 19 then supplies input current to output stage 19. In other words, it transitions or changes to the immediate input current needs of output stage 19. In the preferred embodiment, current source circuit 22 is not allowed to supply a current greater than output stage 19 needs. A larger current could result in the latch up of amplifier 11. This problem is alleviated by adjusting current sense circuit 21 and current source circuit 22 to insure over all conditions (temperature, process, device matching, voltage, etc.) that a current equal to or less than the input current of output stage 19 is delivered by current source circuit 22. Any current not sourced by current source circuit 22 to the input of output stage 19 must be sourced by second gain stage 18 but does not impact performance significantly. It should be noted that current flow direction into or out of blocks of amplifier 11 is not implied in the description cited above, only that current source circuit 22 sources a current (positive or negative) to enable output stage 19 such that second gain stage 18 does not have to source the input current (positive or negative) of output stage 19.

Figure 2:
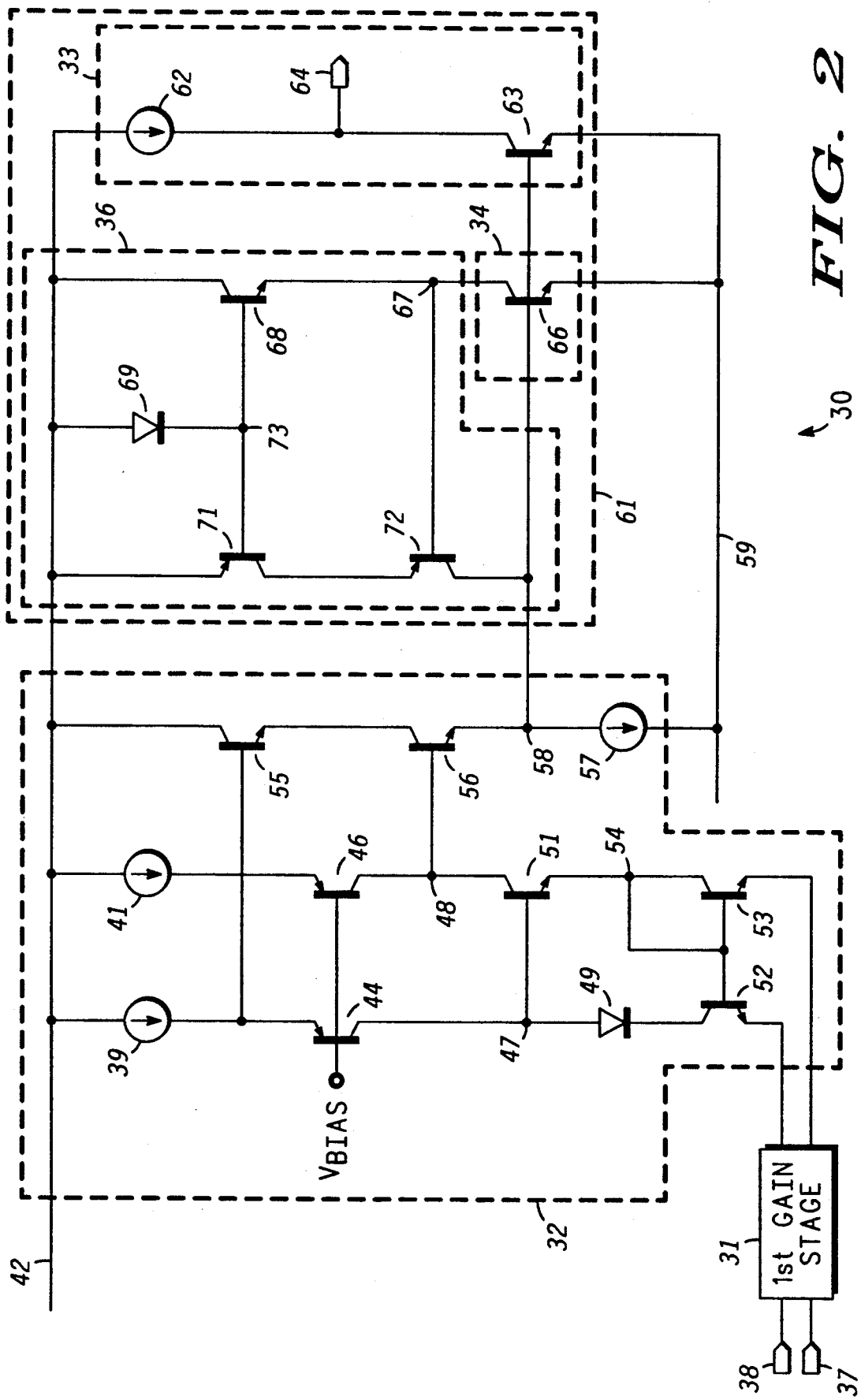
FIG. 2 is schematic diagram of an embodiment of an amplifier in accordance with the present invention.

FIG. 2 is a schematic of an embodiment of a high impedance output driver stage in an amplifier.

An amplifier 30 is a simplified design of an integrated circuit operational amplifier illustrating functioning circuits corresponding to the blocks of FIG. 1. Amplifier 30 comprises a first gain stage 31, a second gain stage 32, an output stage 33, a current sense circuit 34, and a current source circuit 36. First gain stage 31 is a differential gain stage having a first input 37, a second input 38, a first output, and a second output. First input 37 and second input 38 are inputs of amplifier 30. A difference n voltage potential between first input 37 and second input 8 generates a differential input voltage signal which is amplified by first gain stage 31. The amplified differential signal is coupled to a second gain stage 32 through the first output and second output of first gain stage 31.

Second gain stage 32 is an amplification stage having high voltage gain. The amplified differential signal coupled to second gain stage 32 is further amplified and converted to a single ended (nondifferential) voltage signal. Although simplified, the schematic diagram of second gain stage 32 illustrates common features of an amplification stage which benefit significantly through the use of this invention. Other types of gain stage could be used equally well with the a high impedance output driver stage 61.

A current source 39 is coupled to a terminal of power supply 42 and has an output. A PNP transistor 44 has an emitter coupled to the output of current source 39, a base coupled to a D.C. bias voltage Vbias, and a collector coupled to a node 47. A diode 49 has an anode coupled to node 47 and a cathode. A NPN transistor 52 has a collector coupled to the cathode of diode 49, a base coupled to a node 54, and an emitter coupled to the first output of first gain stage 31. The emitter of transistor 52 is an input of second gain stage 32. A NPN transistor 53 has a collector coupled to node 54, a base coupled to node 54, and an emitter coupled to the second output of first gain stage 31. The emitter of transistor 53 is an input of second gain stage 32. A NPN transistor 51 has a collector coupled to a node 48, a base coupled to node 47, and an emitter coupled to node 54. A PNP transistor 46 has a collector coupled to node 48, a base coupled to the D.C. bias voltage Vbias, and an emitter. A current source 41 is coupled to the terminal of power supply 42 and has an output coupled to the emitter of PNP transistor 46. A NPN transistor 55 has a collector coupled to the terminal of power supply 42, a base coupled to the emitter of PNP transistor 44, and an emitter. A NPN transistor 56 has a collector coupled to the emitter of NPN transistor 55, a base coupled to node 48, and a emitter coupled to a node 58. The emitter of transistor 56 is an output of second gain stage 32. A current source 57 completes second gain stage 32 and is coupled to a terminal of power supply 59 and has an output coupled to node 58.

Operation of second gain stage 32 is quite simple and is well known by those skilled in the art. Current sources 39 and 41 output substantially equal currents. Under ideal conditions, second gain stage 32 is in a balanced state when the first and second outputs of first gain stage 31 are at equal voltages. A condition of this balanced state is that collector current output by transistor 46 is approximately the same as collector current into transistor 51. A voltage difference between the first and second outputs of first gain stage 31 will generate a difference current at node 48. The difference current is incrementally positive or negative and results from a difference in current between transistor 46 source current and transistor 51 sink current. The difference current is created, in part, by a current mirror circuit comprising transistors 51, 52, and 53, and diode 49. Transistor 56 is in a voltage follower configuration and acts as a buffer. An incremental positive (or enabling) difference current into the base of transistor 56 will generate a positive incremental current into output stage 33. Similarly, an incremental negative (or disabling) difference current into the base of transistor 56 will reduce current output of transistor 56 thus generating an incremental negative current. In other words, the voltage at node 58 rises and falls depending on the difference current into the base of transistor 56. Vbias is a D.C. voltage coupled to the base of transistor 44 and 46 to bias the transistors. Vbias is chosen to minimize performance impacts on other circuitry in second gain stage 32.

Ideally, it would be beneficial to second gain stage 32 if any loading on node 58 by output stage 33 would not affect the impedance at node 48. The gain of second gain stage 32 is directly related to the impedance at node 48. A high impedance at node 48 over varying conditions (voltage, processing, temperature, device characteristics, etc.) would insure a high voltage gain for second gain stage 32. In reality, output stage 33 can severely impact performance of second gain stage 32. The resistance looking into the base of transistor 56 is approximately the transistor current gain (or beta) × (emitter resistance of transistor 56+resistance at node 58). The input resistance of transistor 56 can be the dominant resistance at node 48 which determines the gain of second gain stage 32. Output stage 33 presents an impedance at node 58 which can vary by orders of magnitude depending on the operating conditions and output loading. This variability will cause the input resistance of transistor 56 to also vary (dependent on operating conditions) which is not conducive to a stable amplifier design. It is typically resolved by use of a buffer stage (as mentioned previously) at the expense of added circuit complexity and increased phase shift. Other secondary problems can also be exaggerated by a low impedance at node 58. These secondary problems can range from increased voltage offset due to imbalanced loading on second gain stage 32 to operation problems at the temperature extremes. Problems of this type can be resolved by limiting the impact of output stage 33 on second gain stage 32 and optimization of each circuit.

Output stage 33 is a simplified driver stage circuit comprising a current source 62 and a NPN transistor 63 for driving a load external to amplifier 30. Current source 62 is coupled to the terminal of power supply 42 and has an output coupled to an amplifier output 64. Transistor 63 has a base, collector, and emitter corresponding to a control input, a first conductive terminal, and a second conductive terminal, respectively. Transistor 63 has the collector coupled to amplifier output 64, the base coupled to node 58, and the emitter coupled to the terminal of power supply 59. Typically, transistor 63 is a high current device which has the potential to degrade performance of second gain stage 32 by lowering the impedance at node 48.

A current sense circuit 34 comprises a NPN transistor 66. Transistor 66 has a base, collector, and emitter corresponding to a control input, a first conductive terminal, and a second conductive terminal, respectively. Transistor 66 has the collector coupled to a node 67, the base coupled to node 58, and the emitter coupled to the terminal of power supply 59. The emitter area of transistor 66 is a predetermined ratio of the emitter area of transistor 63. Transistor 66 will have a collector current related by the predetermined emitter area ratio to a collector current of transistor 63 because the base-emitter junction of transistor 66 is biased identically to the base-emitter junction of transistor 63. In the preferred embodiment, the emitter areas of transistors 66 and 63 are ratioed as accurate as possible. For illustration purposes assume that the emitter area of transistor 63 is 18 times larger than the emitter area of transistor 66.

Current source circuit 36 comprises a NPN transistor 68, a diode 69, a PNP transistor 71, and a PNP transistor 72. Current source circuit 36 is responsive to the collector current of transistor 66 (which is proportional to the current in transistor 63) and outputs a current substantially equal to the combined base currents of transistors 66 and 63, thus reducing drive requirements of transistor 56. Transistor 68 has a base, collector, and emitter corresponding to a control input, a first conductive terminal, and a second conductive terminal, respectively. Transistor 68 has the collector coupled to the terminal of power supply 42, the base coupled to a node 73, and the emitter coupled to the node 67. Diode 69 has an anode and a cathode corresponding to a first terminal and a second terminal, respectively. Diode 69 has the anode coupled to the terminal of power supply 42 and the cathode coupled to node 73. Transistor 71 has a base, collector, and emitter corresponding to a control input, a first conductive terminal, and a second conductive terminal, respectively. Transistor 71 has the base coupled to node 73 and the emitter coupled to the terminal of power supply 42. Transistor 72 has a base, collector, and emitter corresponding to a control input, a first conductive terminal, and a second conductive terminal, respectively. Transistor 72 completes current source circuit 36 and has the collector coupled to node 58, the base coupled to node 67, and the emitter coupled to the collector of transistor 71.

In this example, the collector current of transistor 66 is 1/18 of the collector current of transistor 63. Ideally, current source circuit 36 generates 19 times the base current of transistor 66 thereby supplying base current for both transistor 66 and transistor 63. In the preferred embodiment, transistor 68 is identical to transistor 66 and is biased with the collector current of transistor 66. Transistor 68 is biased to generate a base current which approximates the base current into transistor 66. The base current of transistor 68 is increased nineteenfold by the combination of diode 69 and transistor 71 which acts as a current multiplication circuit. In the preferred embodiment, diode 69 and transistor 71 is made from a split collector lateral PNP transistor. The split collector lateral PNP transistor has the collector area ratioed 19 to one where transistor 71 compromises the portion of the device with 19 times the collector area and diode 69 is formed by coupling the single collector area back to the base region of the split collector PNP. The current through diode 69 (which approximates the base current of transistor 66) is multiplied 19 times by the ratio of collector area of transistor 71 to diode 69, thus the collector current of transistor 71 is approximately nineteen times the base current of transistor 66. In the preferred embodiment, transistor 72 is a cascode device placed in series with transistor 71 to reduce the voltage drop from collector to emitter of transistor 71.

High impedance output driver stage 61 comprises output stage 33, current sense circuit 34, and current source circuit 36. Current sense circuit 34 and current source circuit 36 actively senses current of output stage 33 and sources a current to output stage 33. In the example, current source circuit 36 sources a current approximately 19 times the base current of transistor 66 which is sufficient to source base current for transistors 66 and 63. The magnitude of the current which current source circuit 36 sources will vary dependent on the needs of transistor 63. Ideally, transistor 56 of second gain stage 32 sources no (zero) current to high impedance output driver stage 61. Thus, high impedance output driver stage 61 appears as an infinite impedance (under this ideal condition) thereby eliminating any restrictions placed on the design of second gain stage 32 due to interactions with output stage 33.

In the preferred embodiment, high impedance output driver stage 61 is designed to "always" deliver less current than is needed by transistors 66 and 63. This is critical to prevent a latchup condition and must occur for all operating conditions (temperature, voltage, process, etc.) of amplifier 30. Thus, transistor 56 of second output stage 32 does source current to high impedance stage 61 albeit a significantly smaller current than it would supply driving output stage 33 without current sense circuit 34 and current source circuit 36. An important feature of high impedance output driver stage 61 is that no added components other than output stage 33 are in the gain path of amplifier 30 which minimizes complexity of the amplifier compensation scheme. High impedance output driver stage 61 not only maximizes frequency response of amplifier 30 by not adding any significant phase shift but also allows individual optimization of both second gain stage 32 and output stage 33 because of limited interaction between each other. Stability in sensing and sourcing current over all operating conditions is insured by using device matching to sense current in output stage 33 and also to generate the "reference base current" into transistor 68 thereby tracking over varying conditions. Secondary problems can also be reduced through optimization of the circuitry.

The example of FIG. 2 illustrates one embodiment of high impedance output driver stage 61. In the example, current is sourced to output stage 33. It should be obvious to those skilled in the art that current sense circuit 34 and current source circuit 36 can be designed to "source" or "sink" current (or both) dependent on the application. Also, gain stage circuits and output stage circuits may vary significantly in form from that described in FIG. 2. Because of these variations in circuit design, current sense circuit 34 and current source circuit 36 must be designed for the specific application and may take many different forms, although functionally it will perform similarly to the embodiment described.

By now it should appreciated that a high impedance output driver stage has been described which presents a high impedance to a gain stage thereby reducing performance degradations attributable to gain stage loading.

We claim:

1. An output driver stage having an input responsive to an input signal and an output for providing an output current, comprising:
    an output stage having an input coupled to the input of the output driver stage and an output for providing the output current;
    a sense circuit having an input coupled to the input of the output driver stage and an output for providing a current proportional to the output current; and
    a current source having an input coupled to said output of said sense circuit and an output for providing a current to the input of the output driver stage.

2. An output driver stage as recited in claim 1 wherein said output driver stage includes a power transistor having a first electrode coupled to the output of the output driver stage, a control electrode coupled to the input of the output driver stage, and a second electrode being coupled to receive a supply voltage.

3. An output driver stage as recited in claim 2 wherein the magnitude of said current flowing through said sense circuit is substantially less than the magnitude of said output current of said output stage.

4. An output driver stage as recited in claim 2 wherein said sense circuit comprises a sense transistor having a first electrode coupled to said input of said current source circuit, a control electrode coupled to the input of the output driver stage, and a second electrode being coupled to receive said supply voltage.

5. An output driver stage as recited in claim 4 wherein the conductive areas of said sense transistor and said output transistor are a predetermined ratio.

6. A high input impedance output driver stage having an input responsive to an input signal and an output for providing an output current, comprising:
    a power transistor of a first conductivity type having a first electrode coupled to the output of the output driver stage, a control electrode coupled to the input of the output driver stage for receiving an input current corresponding to the input signal, and a second electrode coupled for receiving a first supply voltage;
    a sense transistor of said first conductivity type having a first electrode for providing a current proportional to the output current, a control electrode coupled to the input of the output driver stage, and a second electrode being coupled to receive said first supply voltage; and
    a current source circuit responsive to said current from said sense transistor including an output coupled to the input of the output driver stage for providing a current substantially equal to said input current.

7. The high impedance output driver stage as recited in claim 6 wherein the conductive areas of said sense transistor and said power transistor are a predetermined ratio and wherein said current of said sense transistor and said output current of said power transistor are proportional to one another by said predetermined ratio.

8. The high input impedance output driver stage as recited in claim 7 wherein the conductive area of said sense transistor is substantially smaller than the conductive area of said power transistor.

9. An output driver stage having an input responsive to an input signal and an output for providing an output current, comprising:
   a power transistor of a first conductivity type having a first electrode for providing the output current coupled to the output of the output driver stage, a control electrode responsive to the input signal coupled to the input of the output driver stage, and a second electrode being coupled to receive a first supply voltage;
   a sense transistor of said first conductivity type having a first electrode for providing a current proportional to the output current, a control electrode coupled to the input of the output driver stage, and a second electrode being coupled to receiver said first supply voltage wherein the conductive areas of said sense transistor and said power transistor are a predetermined ratio, wherein the conductive area of said sense transistor is substantially smaller than the conductive area of said power transistor, and wherein said current of said sense transistor and sad output current of said power transistor are proportional to one another by said predetermined ratio;
   a current source circuit responsive to said current from said sense transistor including an output coupled to said input of said output driver stage for providing a current that varies with the input signal, said current source circuit comprising:
   a first transistor of said first conductivity type responsive to said current of said sense transistor having a first electrode being coupled to receive a second supply voltage, a control electrode, and a second electrode coupled to said first electrode of said sense transistor;
   a diode including a first terminal being coupled to receive said second supply voltage and a second terminal coupled to said control electrode of said first transistor; and
   a second transistor of a second conductivity type having a first electrode coupled to said output of said current source circuit, a control electrode coupled to said control electrode of said first transistor, and a second electrode being coupled to receive said second supply voltage.

10. The output driver stage as recited in claim 9 wherein the conductive areas of said sense and first transistors are a predetermined ratio and wherein the conductive areas of said diode and said second transistor are a predetermined ratio.

11. The output driver stage as recited in claim 10 wherein said current source circuit includes a third transistor of said second conductivity type in a cascode configuration with said second transistor, said third transistor having a first electrode coupled to the output of the current source circuit, a control electrode coupled to said first electrode of said sense transistor, and a second electrode coupled to said first electrode of said second transistor.

12. An amplifier comprising:
   a first gain stage responsive to an input signal and providing a first amplified signal;
   a second gain stage responsive to said first amplified signal and for providing a second amplified signal;
   an output stage having an input responsive to said second amplified signal and an output for providing an output current;
   a sense circuit having an input coupled to said input of said output stage for providing a current proportional to said output current; and
   a current source circuit responsive to said current of said sense circuit for sourcing a current of predetermined magnitude to said input of said output stage for increasing the impedance thereat.

13. The amplifier as recited in claim 12 wherein said output stage includes a power transistor of a first conductivity type having a first electrode coupled to said output of said output stage, a control input coupled to said input of said output stage, and a second electrode being coupled to receive a first supply voltage.

14. The amplifier as recited in claim 13 wherein said sense circuit includes a sense transistor of said first conductivity type having a first electrode for providing a current proportional to said output current, a control electrode coupled to said input of said output stage, and a second electrode being coupled to receive said first supply voltage.

15. The amplifier as recited in claim 14 wherein said current source circuit comprises:
   a first transistor of said first conductivity type having a first electrode being coupled to receive a second supply voltage, a control electrode, and a second electrode coupled to said first electrode of said sense transistor;
   a diode having a first terminal being coupled to receive said second supply voltage and a second terminal coupled to said control electrode of said first transistor; and
   a second transistor of a second conductivity type having a first electrode coupled to said input of said output stage, a control electrode coupled to said control electrode of said first transistor, and a second electrode being coupled to receive said second supply voltage.

16. The amplifier as recited in claim 15 wherein the conductive areas of said sense transistor and said power transistor are a first predetermined ratio, wherein the conductive areas of said sense transistor and said first transistor are a second predetermined ratio, and wherein the conductive areas of said diode and said second transistor are a third predetermined ratio.

17. The amplifier of claim 16 wherein said current output by said second transistor is substantially equal to said input current of said output stage.

18. An amplifier comprising:
   a first gain stage having at least one input and at least one output;
   a voltage gain circuit having at least one input coupled to said at least one output of said first gain stage and an output;
   an output stage responsive to an input current, said output stage having an input coupled to said output of said voltage gain circuit and an output for supplying an output current;

sensing means responsive to said output stage for providing a proportional current to said supplied current of said output stage; and a current source responsive to said proportional current for sourcing a current of predetermined magnitude to the input of the output stage wherein said current source comprises:

a first transistor responsive to said proportional current provided by said sensing means, said first transistor generates an input current proportional to said input current of said output stage;

a diode for supplying said input current to said first transistor;

a second transistor biased similarly to said diode, said second transistor having a conductive area a predetermined ratio of a conductive area of said diode and said second transistor having an output coupled to an input of said output stage for supplying a current; and a third transistor coupled serially with said second transistor to reduce voltage across said second transistor.

19. In an amplifier including a power transistor having an input responsive to an input signal and an output for providing an output current, a method for maintaining the input of the power transistor at a high impedance comprising the steps of:

matching a sense transistor to the power transistor wherein the conductive areas of the power and sense transistors are a predetermined ratio and wherein the conductive area of said sense transistor is substantially less than the conductive area of the power transistor;

operating said sense transistor at a current substantially less than said output current, said sense transistor being responsive to the input signal and said current being proportional to said output current;

biasing a transistor with said current provided by said sense transistor, wherein an input current of said transistor is proportional to an input current of said power transistor;

generating a correction current a predetermined multiple of said input current of said transistor, said correction current being substantially equal to said input current of said power transistor; and providing said correction current to said input of the power transistor.

* * * * *

UNITED STATES PATENT AND TRADEMARK OFFICE
CERTIFICATE OF CORRECTION

PATENT NO. : 5,311,147
DATED     : May 10, 1994
INVENTOR(S) : Thomas Petty and Robert Vyne It is certified that error appears in the above-indentified patent and that said Letters Patent is hereby corrected as shown below:

In column 8, line 65, delete "rom" and insert therefor --from--.

In column 9, line 1, delete "high impedance" and insert therefor --high input impedance--.

In column 9, line 26, delete "receiver" and input therefor --receive--.

In column 9, line 33, delete "sad" and insert therefor --said--.

Signed and Sealed this

Seventh Day of February, 1995

Attest:

BRUCE LEHMAN

Attesting Officer

Commissioner of Patents and Trademarks